United States Patent
Ko (10) Patent No.: US 10,121,774 B2
(45) Date of Patent: Nov. 6, 2018

(54) METHOD OF MANUFACTURING A SEMICONDUCTOR PACKAGE

(71) Applicant: Junyoung Ko, Cheonan-si (KR)

(72) Inventor: Junyoung Ko, Cheonan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 122 days.

(21) Appl. No.: 15/207,496

(22) Filed: Jul. 11, 2016

(65) Prior Publication Data

US 2017/0040308 A1    Feb. 9, 2017

(30) Foreign Application Priority Data

Aug. 3, 2015    (KR) .................. 10-2015-0109531

(51) Int. Cl.
*H01L 25/00* (2006.01)
*H01L 25/10* (2006.01)
*H01L 21/48* (2006.01)
*H01L 21/56* (2006.01)
*H01L 21/78* (2006.01)

(52) U.S. Cl.
CPC ......... *H01L 25/50* (2013.01); *H01L 21/4853* (2013.01); *H01L 21/563* (2013.01); *H01L 21/565* (2013.01); *H01L 21/78* (2013.01); *H01L 25/105* (2013.01); *H01L 2224/16225* (2013.01); *H01L 2224/73204* (2013.01); *H01L 2224/97* (2013.01); *H01L 2225/1017* (2013.01); *H01L 2225/1058* (2013.01); *H01L 2924/15311* (2013.01); *H01L 2924/181* (2013.01)

(58) Field of Classification Search
CPC .... H01L 25/50; H01L 21/4853; H01L 21/563
See application file for complete search history.

(56) References Cited

U.S. PATENT DOCUMENTS

| 8,889,484 B2 | 11/2014 | Chen et al. |
| 8,912,651 B2 | 12/2014 | Yu et al. |
| 2012/0056321 A1* | 3/2012 | Pagaila ............ H01L 23/49827 257/737 |
| 2012/0326331 A1 | 12/2012 | Han et al. |

(Continued)

FOREIGN PATENT DOCUMENTS

| KR | 20130061039 A | 6/2013 |
| KR | 20140092018 A | 7/2014 |

(Continued)

*Primary Examiner* — Errol Fernandes
(74) *Attorney, Agent, or Firm* — Renaissance IP Law Group LLP (57) ABSTRACT

Embodiments of inventive concepts disclosed provide a method of manufacturing a semiconductor package. The method includes mounting a plurality of semiconductor chips on a substrate having a connecting member protruding from a top surface of the substrate, applying a non-conductive paste on the substrate and the semiconductor chips, forming a supporting layer coupling each of the semiconductor chips to the substrate, aligning an interposer on the non-conductive paste, forming a non-conductive layer by applying heat while pressing the interposer and the substrate against each other, and cutting the substrate, the non-conductive layer, and the interposer into separate unit packages, each of which include a semiconductor chip.

20 Claims, 12 Drawing Sheets

(56) References Cited

U.S. PATENT DOCUMENTS

| | | |
|---|---|---|
| 2013/0134588 A1 | 5/2013 | Yu et al. |
| 2013/0277826 A9 | 10/2013 | Pendse |
| 2014/0048906 A1 | 2/2014 | Shim et al. |
| 2014/0084441 A1 | 3/2014 | Chiu |
| 2014/0091471 A1 | 4/2014 | Chen et al. |
| 2014/0151878 A1 | 6/2014 | Lin et al. |
| 2014/0151880 A1 | 6/2014 | Kao et al. |
| 2014/0210101 A1 | 7/2014 | Lin et al. |
| 2014/0210106 A1 | 7/2014 | Zhai |
| 2014/0319668 A1 | 10/2014 | Chen et al. |
| 2015/0061095 A1* | 3/2015 | Choi ................. H01L 24/20 257/675 |
| 2015/0069595 A1 | 3/2015 | Chen et al. |
| 2015/0069606 A1 | 3/2015 | Liu et al. |
| 2015/0069637 A1 | 3/2015 | Zhao et al. |
| 2015/0084170 A1 | 3/2015 | Im et al. |
| 2016/0225692 A1* | 8/2016 | Kim ................. H01L 23/49827 |

FOREIGN PATENT DOCUMENTS

| | | |
|---|---|---|
| KR | 20140142573 A | 12/2014 |
| KR | 20150033133 A | 4/2015 |
| KR | 20150038448 A | 4/2015 |

\* cited by examiner

METHOD OF MANUFACTURING A SEMICONDUCTOR PACKAGE

CROSS-REFERENCE TO RELATED APPLICATION

This U.S. non-provisional patent application claims priority under 35 U.S.C. § 119 to Korean Patent Application No. 10-2015-0109531, filed on Aug. 3, 2015, in the Korean Intellectual Property Office, the disclosure of which is hereby incorporated by reference in its entirety.

BACKGROUND

Embodiments described herein relate generally to a semiconductor package and, more particularly, to a method of manufacturing a semiconductor package using a connecting member.

Highly-functional, high-speed and small electronic components have been increasingly demanded with the development of an electronic industry. Various semiconductor packaging techniques have been developed to satisfy these demands. For example, a plurality of semiconductor chips may be stacked on one package substrate, or a semiconductor package may be stacked on another semiconductor package.

In a package-on-package (PoP) device, an interposer may be provided between an upper package and a lower package to electrically connect the upper package to the lower package. The upper package may be easily connected to the lower package by the interposer. In addition, the interposer may prevent warpage of the upper and lower packages.

SUMMARY

Some embodiments described herein provide a method of manufacturing a semiconductor package capable of minimizing or preventing warpage of a semiconductor package. Also, some embodiments described herein provide a method of manufacturing a semiconductor package capable of reducing or minimizing a pitch of connecting members.

In one embodiment, a method of manufacturing a semiconductor package may include mounting a plurality of semiconductor chips on a substrate that has a connecting member protruding from a top surface thereof, applying a non-conductive paste on the substrate and the semiconductor chips, forming a supporting layer coupling each of the semiconductor chips to the substrate, aligning an interposer on the non-conductive paste, applying heat while pressing the interposer and the substrate against each other to form a non-conductive layer, and cutting the substrate, the non-conductive layer, and the interposer into separate unit packages, each including a semiconductor chip. The connecting member may include a pillar in contact with the substrate, and a solder disposed on the pillar.

In another embodiment, a method of manufacturing a semiconductor package may include mounting a plurality of semiconductor chips on a top surface of a substrate, applying a non-conductive paste on the substrate and the semiconductor chips, forming a supporting layer between the substrate and each of the semiconductor chips, providing an interposer having a connecting member protruding toward the substrate onto the substrate, thermally pressing the interposer and the substrate to form a non-conductive layer between the substrate and the interposer, bonding an external terminal to a bottom surface of the substrate, and cutting the substrate, the non-conductive layer, and the interposer between the semiconductor chips into separate unit packages, each including a semiconductor chip. The connecting member may include a pillar being in contact with the interposer, and a solder disposed on a bottom surface of the pillar.

In another embodiment, a method of manufacturing a semiconductor package may include providing a substrate having a plurality of connecting pads, mounting a plurality of semiconductor chips onto a surface of substrate such that the semiconductor chips are spaced apart from the surface of the substrate and such that the semiconductor chips are electrically connected to the connecting pads and, after mounting the semiconductor chips, providing a non-conductive material on the surface of the substrate wherein a portion of the non-conductive material partially fills a space between the semiconductor chips. An interposer may be provided over the substrate having the non-conductive material provided thereon. In this embodiment, at least one selected from the group consisting of the interposer and the substrate includes a connecting member protruding from a surface thereof, and the connecting member includes a pillar and solder disposed on the pillar. Thereafter, in a thermal pressing process, heat is applied to form a non-conductive layer between the substrate and the interposer while pressing the interposer and the substrate against the connecting member. The non-conductive material and the connecting member are arranged such that the connecting member is pressed into the non-conductive material during the thermal pressing process. The substrate, the non-conductive layer, and the interposer are then cut into separate unit packages, such that each unit package includes at least one of the semiconductor chips.

BRIEF DESCRIPTION OF THE DRAWINGS

Embodiments of the inventive concepts will become more apparent in view of the attached drawings and accompanying detailed description.

DETAILED DESCRIPTION OF THE EMBODIMENTS

Various example embodiments of the present invention will now be described more fully hereinafter with reference to the accompanying drawings. Some advantages and features of the inventive concepts and methods of achieving them will be apparent from the following exemplary embodiments that will be described in more detail with reference to the accompanying drawings. It should be noted, however, that the disclosed embodiments may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity. The same reference numerals or the same reference designators denote the same elements throughout the specification.

As used herein, the singular forms "a," an and the are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, exemplary embodiments are described herein with reference to cross-sectional views and/or plan views that are idealized exemplary views. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1:
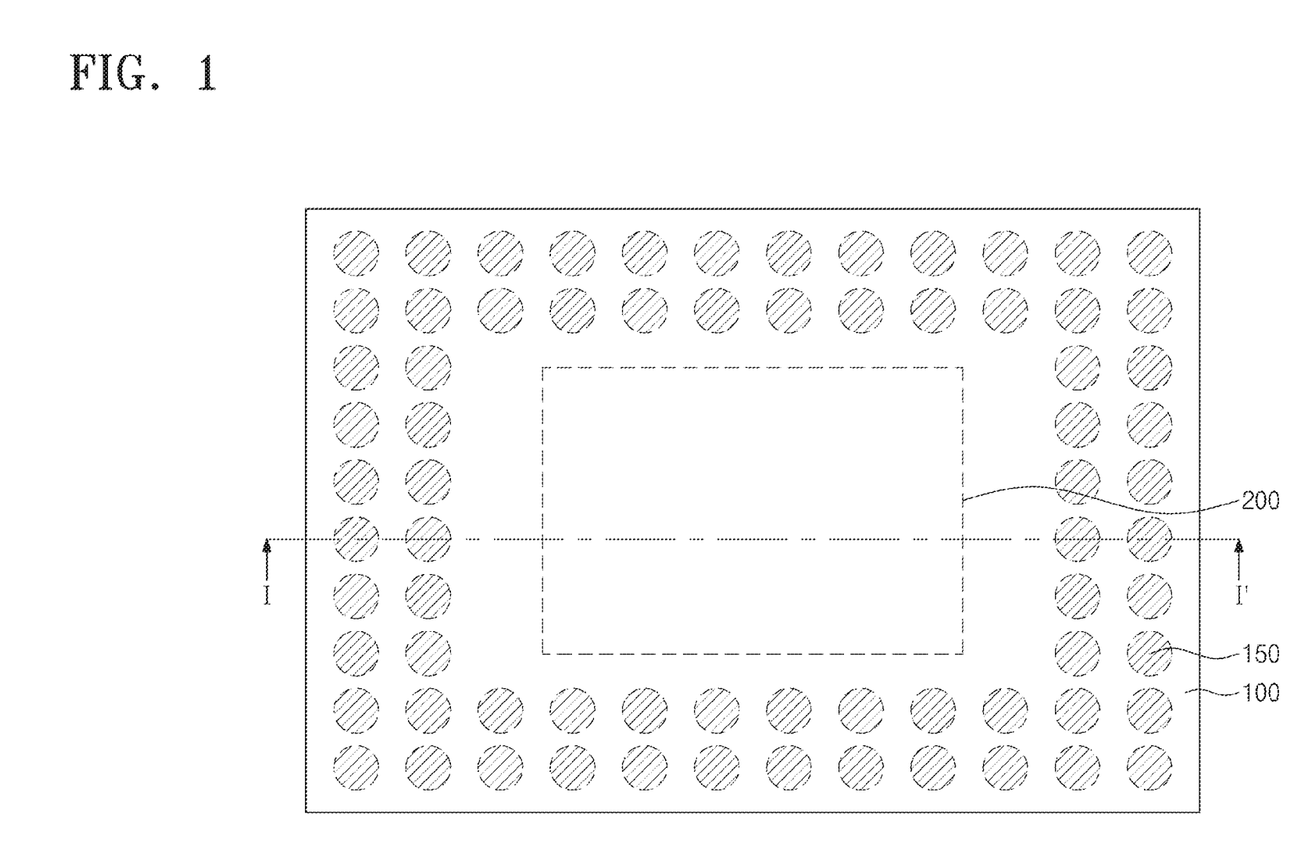
FIG. 1 is a plan view illustrating a semiconductor package according to an embodiment of the inventive concepts.
Figure 2:
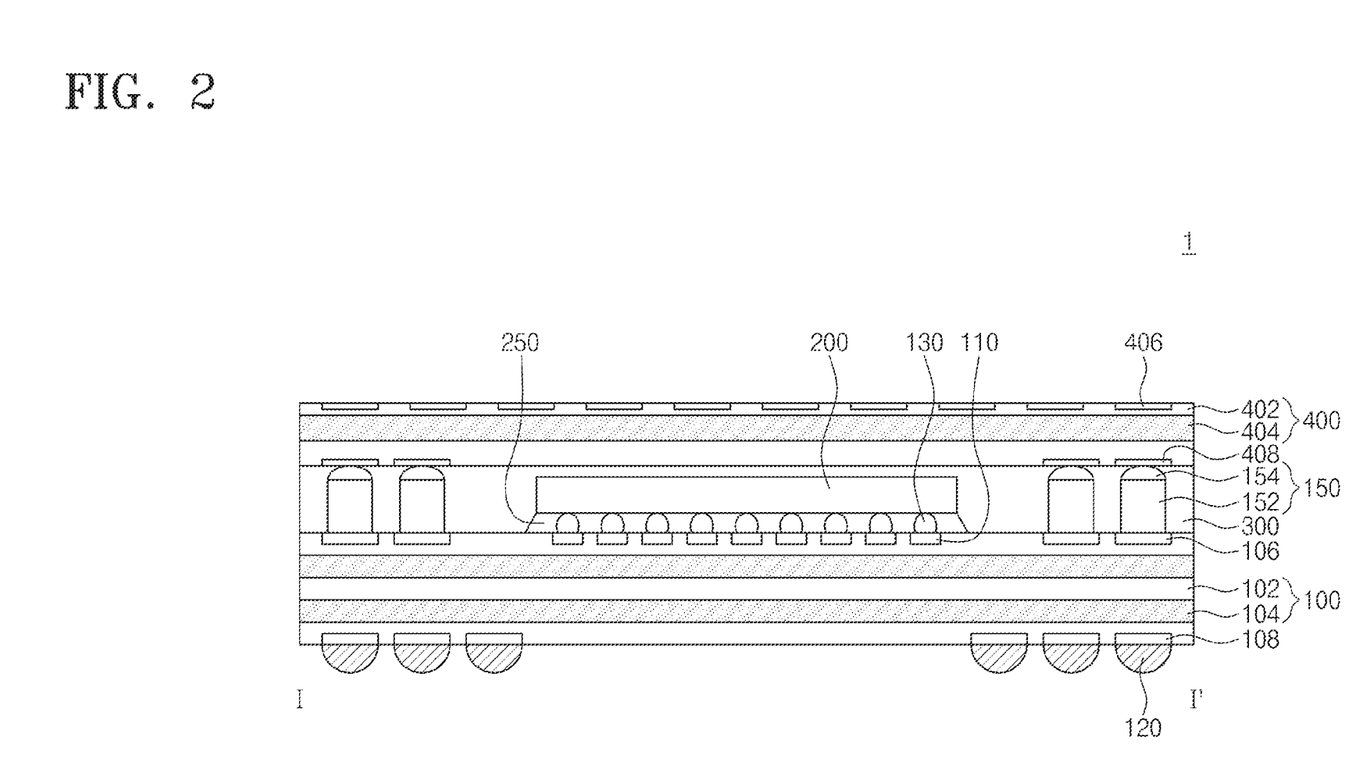
FIG. 2 is a cross-sectional view taken along line I-I' shown in FIG. 1.

FIG. 1 is a plan view illustrating a semiconductor package according to an embodiment of the inventive concepts. FIG. 2 is a cross-sectional view taken along line I-I' shown in FIG. 1.

Referring to FIGS. 1 and 2, a semiconductor package 1 may include a substrate 100, a semiconductor chip 200, a non-conductive layer 300, and an interposer 400.

The substrate 100 may be a printed circuit board (PCB) including first insulating layers 102 and first interconnection layers 104, which are alternately stacked. Connecting pads 110 and first circuit patterns 106 may be provided on a top surface of the substrate 100. External terminals 120, such as solder balls, may be bonded to a bottom surface of the substrate 100. An external terminal 120 may include at least one of tin (Sn), lead (Pb), nickel (Ni), gold (Au), silver (Ag), copper (Cu), or bismuth (Bi). An external pad 108 may be disposed between the substrate 100 and the external terminal 120.

The semiconductor chip 200 may be mounted on the substrate 100. The semiconductor chip 200 may be a non-memory chip, such as an application processor. Chip-connecting terminals 130 may be provided between the semiconductor chip 200 and the substrate 100 to electrically connect the semiconductor chip 200 to the substrate 100. The chip-connecting terminals 130 may be disposed on the connecting pads 110. The chip-connecting terminals 130 may include at least one of tin (Sn), lead (Pb), nickel (Ni), gold (Au), silver (Ag), copper (Cu), or bismuth (Bi).

A supporting layer 250 may fill an empty space between the semiconductor chip 200 and the substrate 100. The supporting layer 250 may cover a portion of the top surface of the substrate 100 and may be in contact with the semiconductor chip 200. The supporting layer 250 may be an electrically insulating layer. For example, the supporting layer 250 may include an epoxy-based material that does not contain conductive particles. The supporting layer 250 may fix the semiconductor chip 200 on the substrate 100 to prevent the semiconductor chip 200 from being broken.

The non-conductive layer 300 may be provided to cover the substrate 100 and the semiconductor chip 200. The non-conductive layer 300 may be an electrically insulating layer. For example, the non-conductive layer 300 may include an epoxy-based material that does not contain conductive particles. The non-conductive layer 300 may act as an adhesive for coupling the substrate 100 to the interposer 400. The non-conductive layer 300 may be in physical contact with a bottom surface of the interposer 400, thereby reducing a thickness of the semiconductor package 1. In addition, the non-conductive layer 300 may fix and couple the interposer 400 to the substrate 100. Thus, the non-conductive layer 300 may support the interposer 400 to prevent warpage of the semiconductor package 1.

The interposer 400 may be disposed on the non-conductive layer 300. The interposer 400 may include a second insulating layer 402 and a second interconnection layer 404, which are alternately stacked. Second circuit patterns 406 may be provided on a top surface of the interposer 400, and interposer pads 408 may be provided on a bottom surface of the interposer 400. The interposer 400 can facilitate easy connection of the substrate 100 and the semiconductor chip 200 to other electronic components.

One or more connecting members 150 may be disposed on the first circuit pattern 106 of the substrate 100. Each connecting member 150 may protrude from the substrate 100 toward the interposer 400, and may electrically connect the substrate 100 to the interposer 400. In the illustrated embodiment, a plurality of connecting members 150 may be arranged to surround the semiconductor chip 200 when viewed from a plan view. The connecting member 150 may include a pillar 152 contacting the top surface of the substrate 100, and a solder 154 disposed on the pillar 152. The pillar 152 may have a cylindrical shape extending from the top surface of the substrate 100 toward the interposer 400, and may include copper (Cu). The solder 154 may include at least one of tin (Sn), lead (Pb), nickel (Ni), gold (Au), silver (Ag), copper (Cu), or bismuth (Bi). A melting point of the pillar 152 may be higher than that of the solder 154, and the melting temperature of the solder 154 may be similar to a hardening (or curing) temperature of the non-conductive layer 300.

Since the semiconductor package 1 according to embodiments of the inventive concepts includes a non-conductive layer 300 that does not contain electrically conductive particles, a pitch of the connecting members 150 may be reduced or minimized without creating an electrical short between the connecting members 150. In addition, an occupied area of the connecting members 150 having the cylindrical shapes may be smaller than that of conventional solder balls, and thus the number of the connecting members 150 in a unit area may be increased. As the number of the connecting members 150 provided on the substrate 100 increases, the number of input/output (I/O) pins provided in the semiconductor package 1 may also increase and a bonding strength between the substrate 100 and the interposer 400 may increase correspondingly.

FIGS. 3A to 3G are cross-sectional views illustrating a method of manufacturing a semiconductor package, according to an embodiment of the inventive concepts.

Figure 3A:
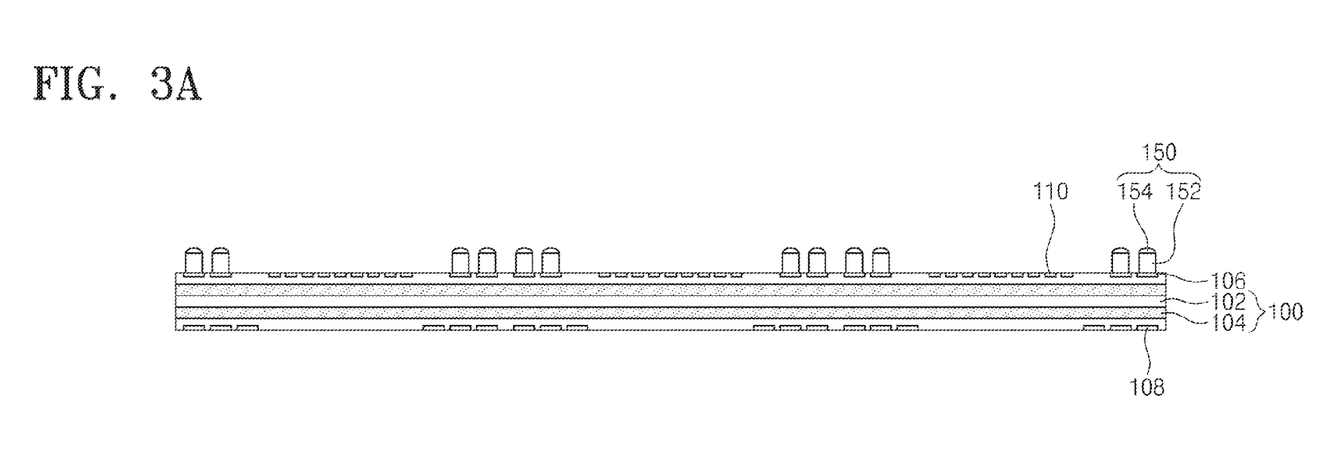
FIGS. 3A to 3G are cross-sectional views illustrating a method of manufacturing a semiconductor package, according to an embodiment of the inventive concepts.

Referring to FIG. 3A, a substrate 100 having a plurality of connecting members 150 disposed thereon may be provided. The substrate 100 may be a printed circuit board (PCB). First circuit patterns 106 and connecting pads 110 may be provided on a top surface of the substrate 100, and external pads 108 may be provided on a bottom surface of the substrate 100. Each of the connecting members 150 may include a pillar 152 contacting the top surface of the substrate 100, and solder 154 disposed on the pillar 152. The pillar 152 may have a cylindrical shape extending upwardly from the top surface of the substrate 100 and may include copper (Cu). The solder 154 may include at least one of tin (Sn), lead (Pb), nickel (Ni), gold (Au), silver (Ag), copper (Cu), or bismuth (Bi). A melting point of the pillar 152 may be higher than that of the solder 154, and the melting temperature of the solder 154 may be similar to a hardening temperature of a non-conductive layer 300 to be described later.

Figure 3B:
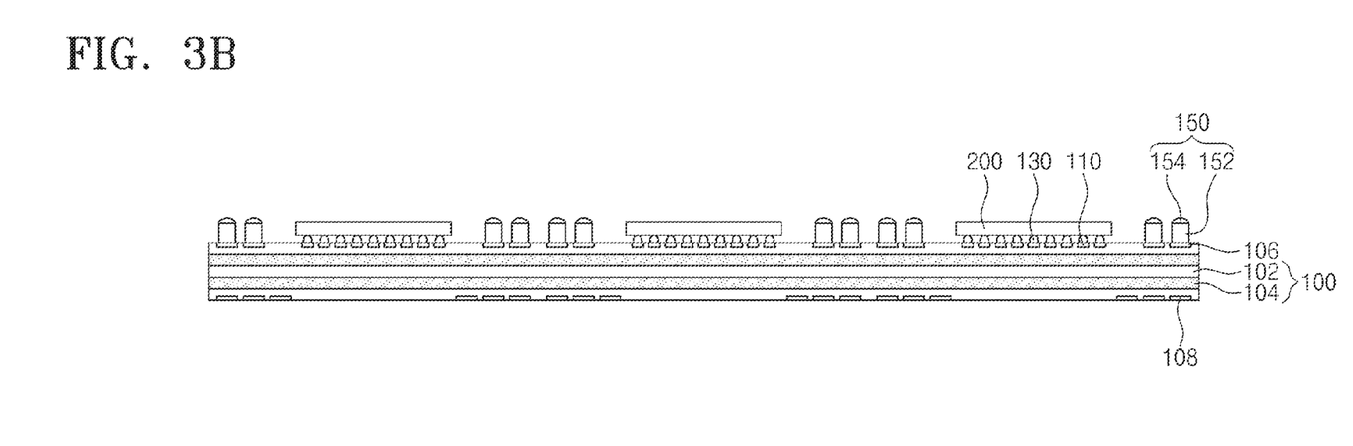

Referring to FIG. 3B, a plurality of semiconductor chips 200 may be mounted on the substrate 100. Chip-connecting terminals 130 may be provided on the connecting pads 110, and the semiconductor chips 200 may be provided on the chip-connecting terminals 130. The chip-connecting terminals 130 may electrically connect the semiconductor chips 200 to the substrate 100. The chip-connecting terminals 130 may include at least one of tin (Sn), lead (Pb), nickel (Ni), gold (Au), silver (Ag), copper (Cu), or bismuth (Bi).

Figure 3C:
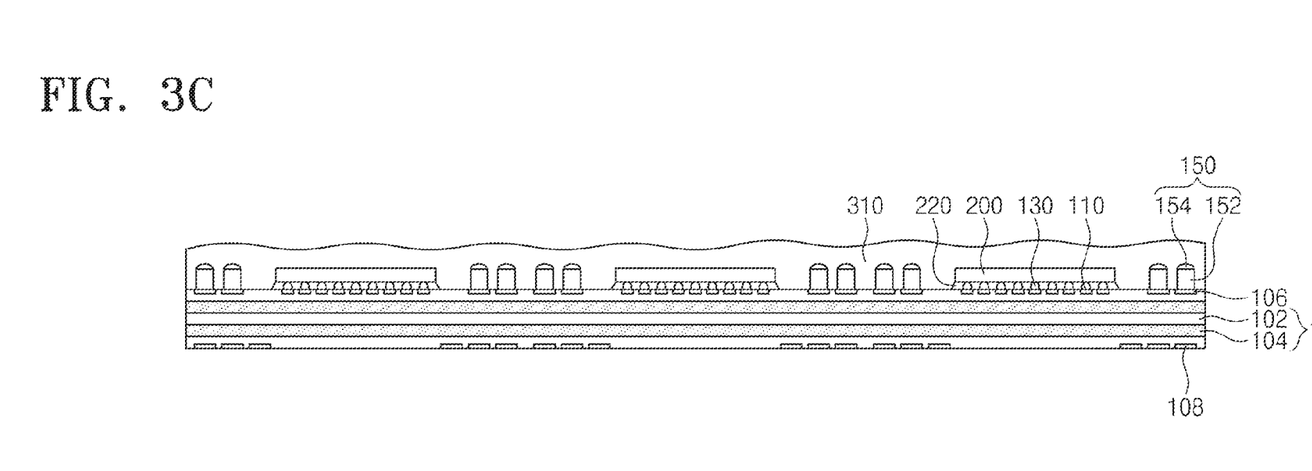

Referring to FIG. 3C, a non-conductive paste 310 may be applied on the substrate 100 and the semiconductor chips 200. The non-conductive paste 310 may be formed of an epoxy-based material that does not contain electrically conductive particles. The non-conductive paste 310 may not fill a space between the substrate 100 and each of the semiconductor chips 200, and thus a void 220 may be generated between the substrate 100 and each of the semiconductor chips 200.

Figure 3D:
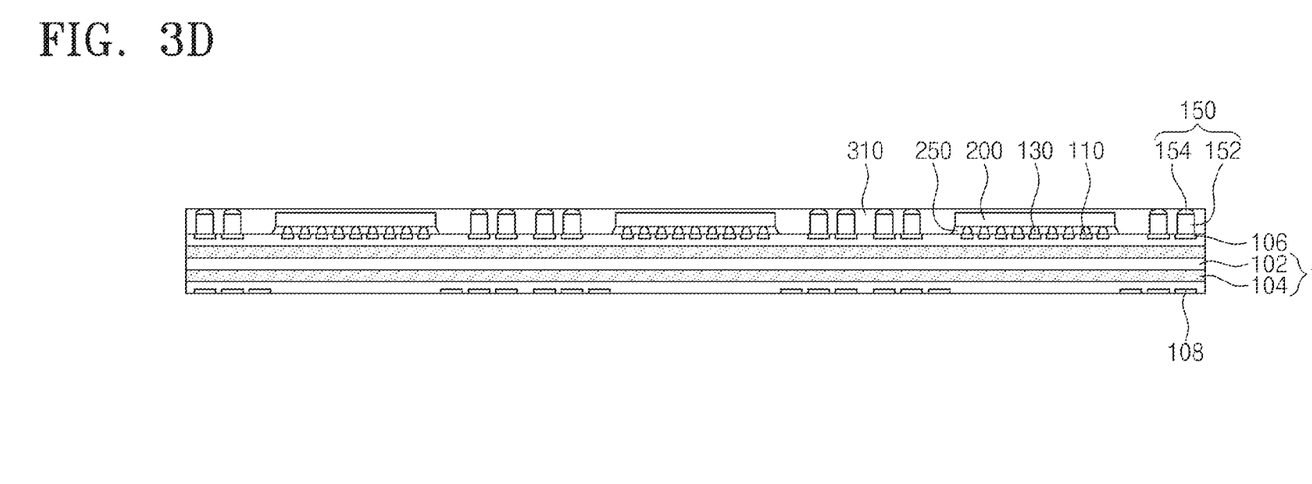

Referring to FIG. 3D, supporting layers 250 coupling the semiconductor chips 200 to the substrate 100 may be formed. In one embodiment, supporting layers 250 are formed by heating the non-conductive paste 310 to thereby reduce the viscosity of the non-conductive paste 310. For example, the non-conductive paste 310 may flow on the substrate 100 at a process temperature of 50 degrees Celsius to 150 degrees Celsius. At this time, the inside of a chamber (not shown) in which this process is performed may be in a vacuum state. In the vacuum state, a gas (e.g., air) may escape from the voids 220 between the substrate 100 and the semiconductor chips 200, thereby allowing the non-conductive paste 310 to fill the voids 220. After the non-conductive paste 310 has suitably filled the voids 220, the process temperature may be reduced to a room temperature (e.g., 25 degrees Celsius), to harden or cure the non-conductive paste 310. The non-conductive paste 310, thus hardened between the substrate 100 and a semiconductor chip 200, may be hereinafter defined as a supporting layer 250.

Alternatively, the supporting layers 250 may be formed by heating the non-conductive paste 310, to thereby reduce the viscosity of the non-conductive paste 310, while maintaining inside of the chamber at a pressure higher than a normal pressure (e.g., by maintaining the pressure inside the chamber at 0.1 MPa or more). At this time, the non-conductive paste 310 may be forced into the voids 220 between the substrate 100 and the semiconductor chips 200. After the non-conductive paste 310 has suitably filled the voids 220, the process temperature may be reduced to room temperature (e.g., 25 degrees Celsius) to harden the non-conductive paste 310. As a result, the supporting layer 250 may be formed.

Figure 3E:
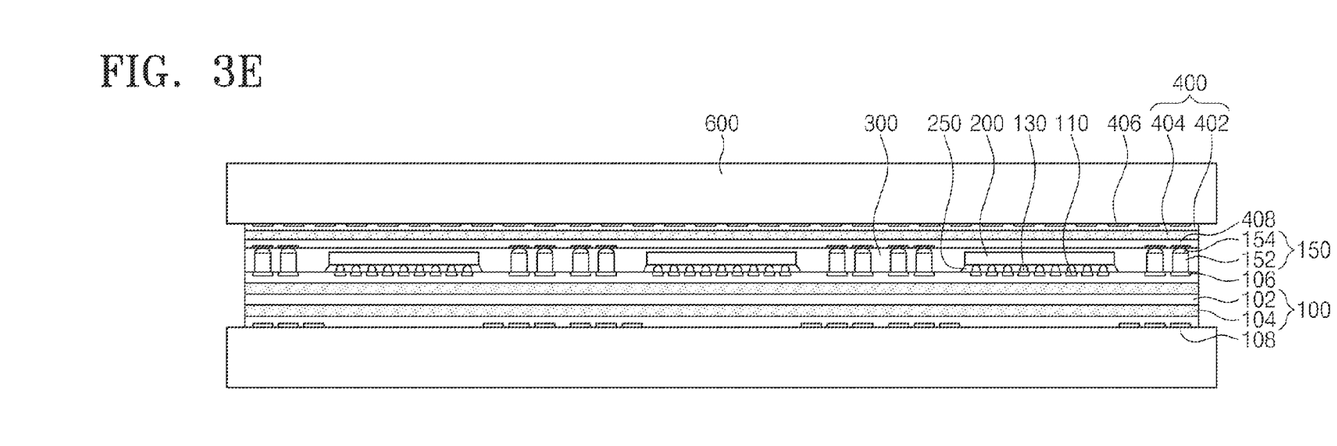

Referring to FIG. 3E, an interposer 400 may be aligned on the non-conductive paste 310, and the interposer 400 and the substrate 100 may be thermally pressed together (e.g., using a bonding tool 600). For example, a pressure higher than the normal pressure (e.g., 0.1 MPa) may be applied to the interposer 400 at a process temperature (e.g., in a range of 220 degrees Celsius to 300 degrees Celsius) higher than a room temperature (e.g., 25 degrees Celsius), thereby thermally pressing the interposer 400 and the substrate 100. Interposer pads 408 disposed on a bottom surface of the interposer 400 may come into contact with the connecting members 150. Heat applied during the thermal pressing process may melt the solder 154 of the connecting members 150 to bond the connecting members 150 to the interposer pads 408. The melting temperature of the solder 154 may be similar to the hardening temperature of the non-conductive paste 310, and the pillar 152 may be melted at a temperature higher than the process temperature of, for example, 220 degrees Celsius to 300 degrees Celsius. The melting point of the pillar 152 may be higher than that of the solder 154, and thus, the pillar 152 may not be melted during the thermal pressing process, but the solder 154 may be melted to be bonded to the interposer pad 408. The non-conductive paste 310 may be hardened during the thermal pressing process to form the non-conductive layer 300. The non-conductive layer 300 may physically contact the interposer 400. Since the thermal pressing process is performed in a state in which one interposer 400 is disposed on the plurality of semiconductor chips 200, a productivity of the thermal pressing process may be improved. The processes of the manufacturing method according to embodiments disclosed herein may thus be relatively simplified as compared with processes in which an interposer is provided on a semiconductor chip of a single unit package (e.g., obtained after separating unit packages from each other). Thus, embodiments of the inventive concepts make it possible to reduce a manufacturing time and costs for manufacturing semiconductor packages.

Figure 3F:
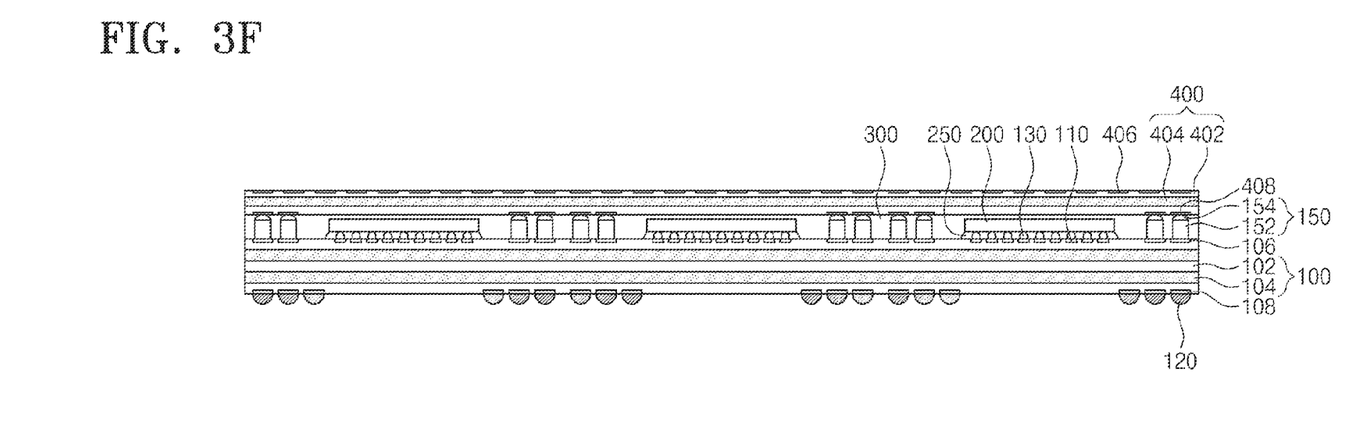

Referring to FIG. 3F, external terminals 120 may be bonded to the bottom surface of the substrate 100. The external terminals 120 may be provided on the external pads 108. The external terminals 120 may include at least one of tin (Sn), lead (Pb), nickel (Ni), gold (Au), silver (Ag), copper (Cu), or bismuth (Bi).

Figure 3G:
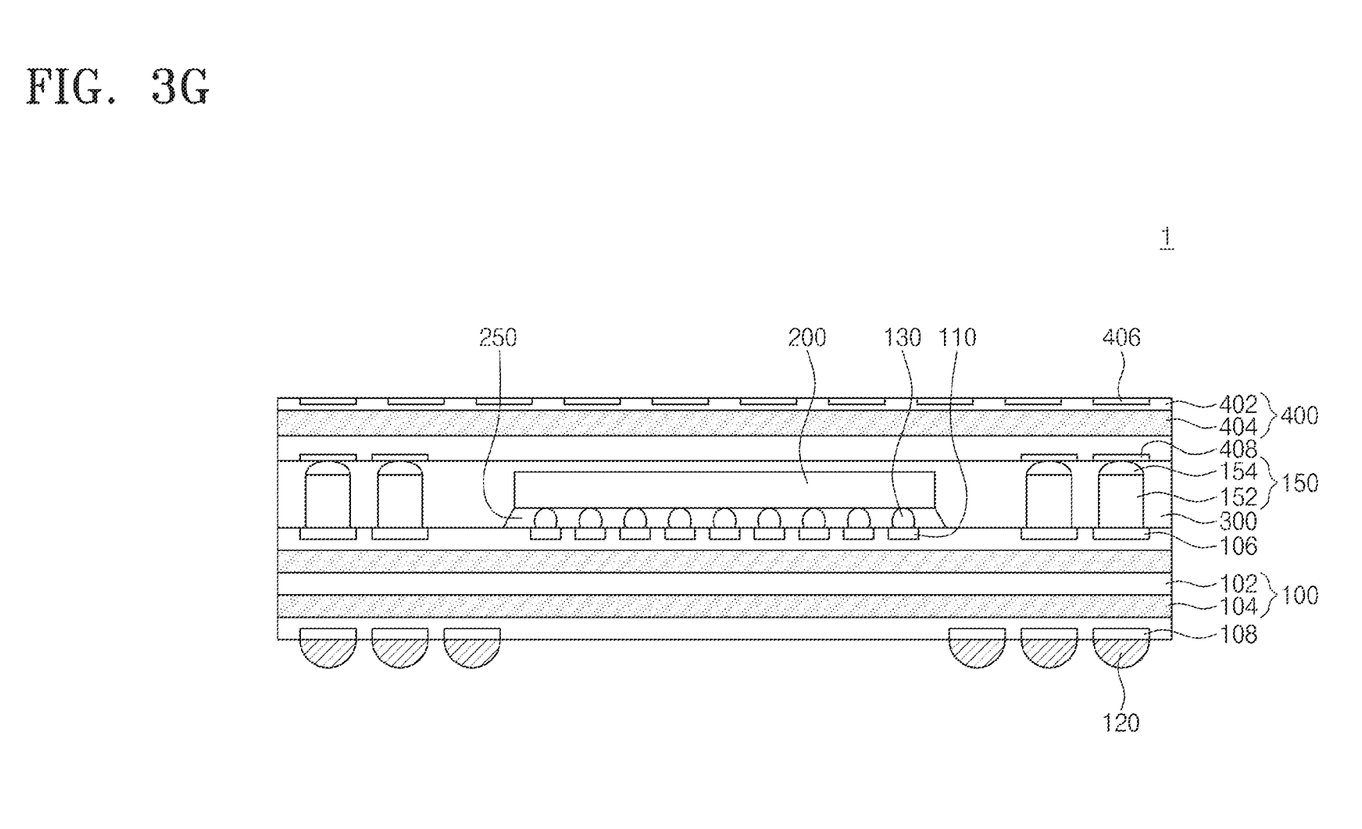

Referring to FIG. 3G, the substrate 100, the non-conductive layer 300, and the interposer 400 may be cut into separate unit packages, respectively including one or more semiconductor chips 200. Once separated from each other, the unit packages may correspond to semiconductor packages 1. A plurality of the semiconductor packages 1 may be formed by the cutting process, and each of the semiconductor packages 1 may include at least one semiconductor chip 200 and one interposer 400 sequentially stacked on one substrate 100.

FIGS. 4A to 4G are cross-sectional views illustrating a method of manufacturing a semiconductor package, according to an embodiment of the inventive concepts. In the present embodiment, the descriptions to the same technical features as in the above embodiment of FIGS. 3A to 3G will be omitted or mentioned briefly for the purpose of ease and convenience in explanation.

Figure 4A:
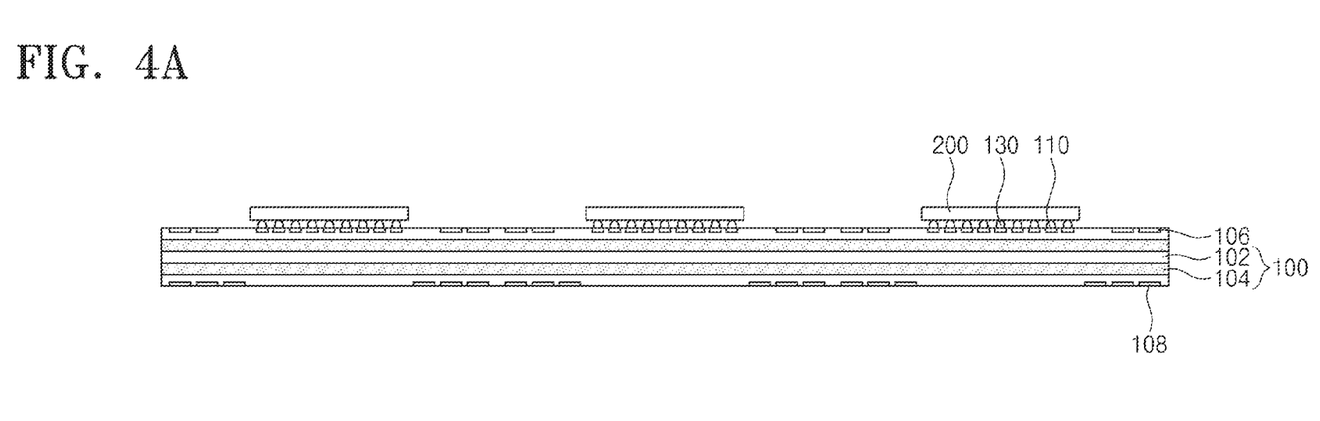
FIGS. 4A to 4G are cross-sectional views illustrating a method of manufacturing a semiconductor package, according to an embodiment of the inventive concepts.

Referring to FIG. 4A, a plurality of semiconductor chips 200 may be mounted on a substrate 100. The semiconductor chips 200 may be electrically connected to the substrate 100 through connecting pads 110 and the chip-connecting terminals 130.

Figure 4B:
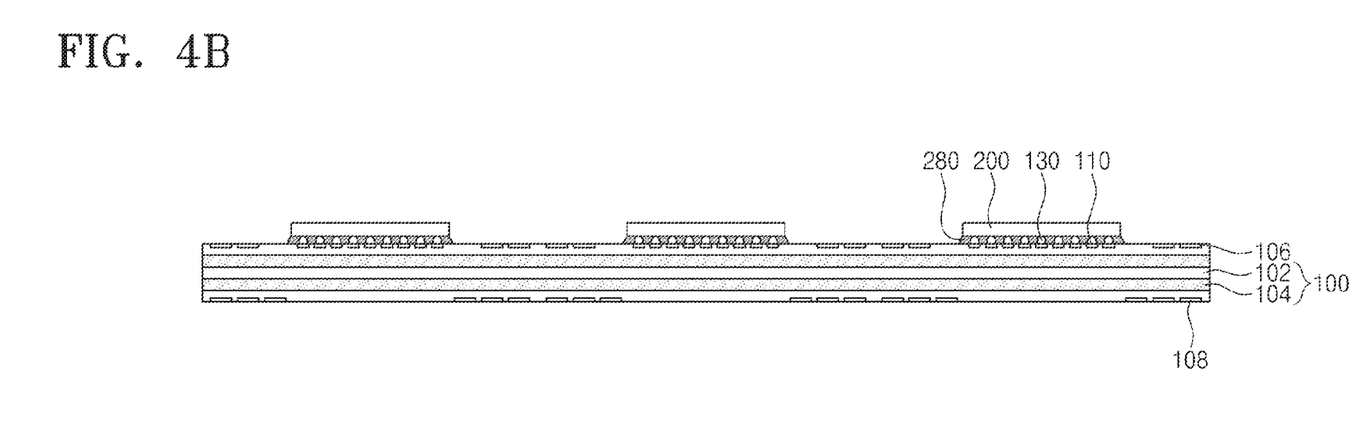

Referring to FIG. 4B, an underfill layer 280 may be formed to fill a space between the substrate 100 and each of the semiconductor chips 200. The underfill layer 280 may be formed by an underfill process (e.g., including acts of applying an underfill paste and hardening the underfill paste). The underfill paste may, for example, be formed of an epoxy-based material that does not contain conductive particles, and may be hardened at a temperature of 80 degrees Celsius to 200 degrees Celsius. Once hardened, underfill paste may be considered to be the underfill layer 280, which fix the semiconductor chip 200 on the substrate 100 to prevent the semiconductor chip 200 from being broken.

Figure 4C:
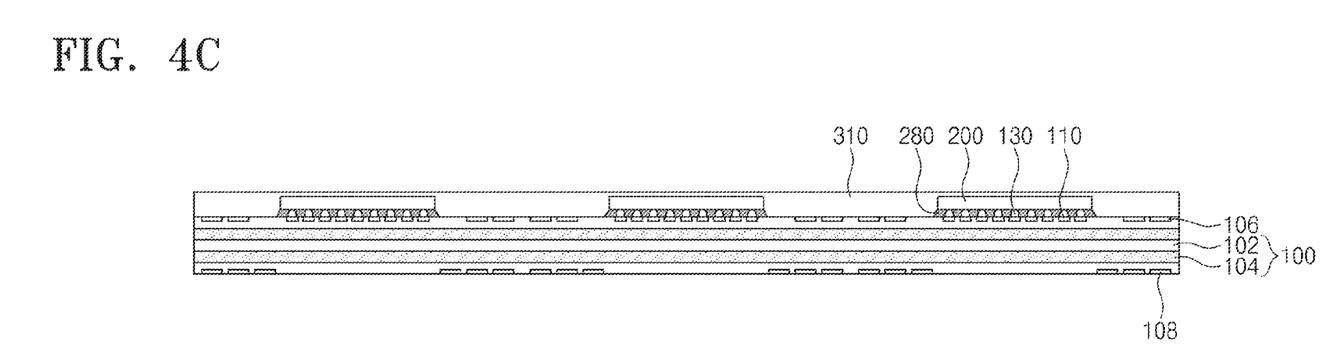

Referring to FIG. 4C, a non-conductive paste 310 may be applied on the substrate 100 and the semiconductor chips 200. The non-conductive paste 310 may be formed of an epoxy-based material that does not contain conductive particles. A hardening temperature of the non-conductive paste 310 may be higher than the hardening temperature of the aforementioned underfill paste. For example, the non-conductive paste 310 may be hardened at a temperature of 220 degrees Celsius to 300 degrees Celsius.

Figure 4D:
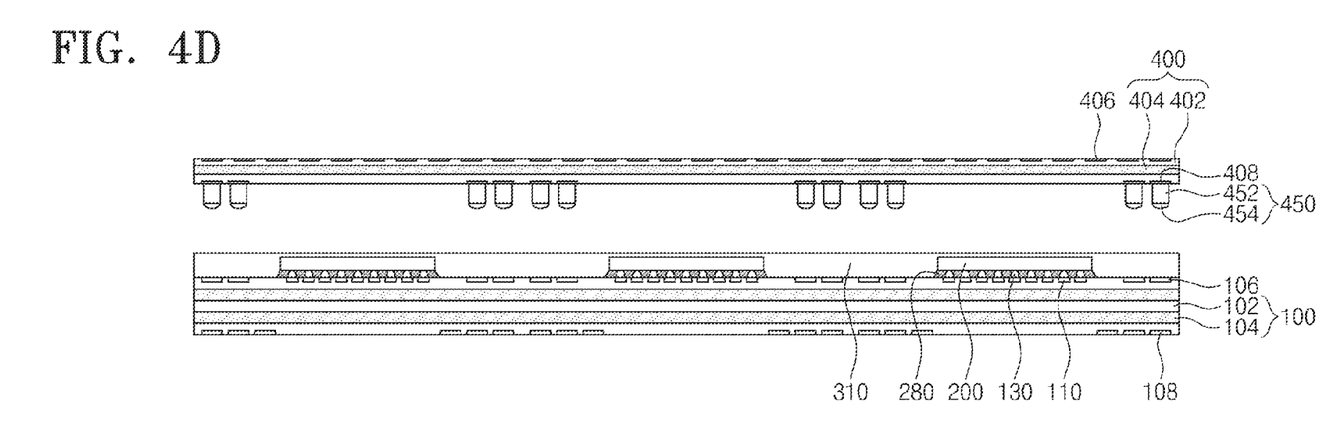

Referring to FIG. 4D, an interposer 400 may be provided on the substrate 100. The interposer 400 may have connecting members 450 protruding toward the substrate 100. Each of the connecting members 450 may include a pillar 452 contacting a bottom surface of the interposer 400, and solder 454 disposed on a bottom surface of the pillar 452. The pillar 452 may have a cylindrical shape extending from the bottom surface of the interposer 400 toward the substrate 100. For example, the pillar 452 may include copper (Cu), and the solder 454 may include at least one of tin (Sn), lead (Pb), nickel (Ni), gold (Au), silver (Ag), copper (Cu), or bismuth (Bi).

Figure 4E:
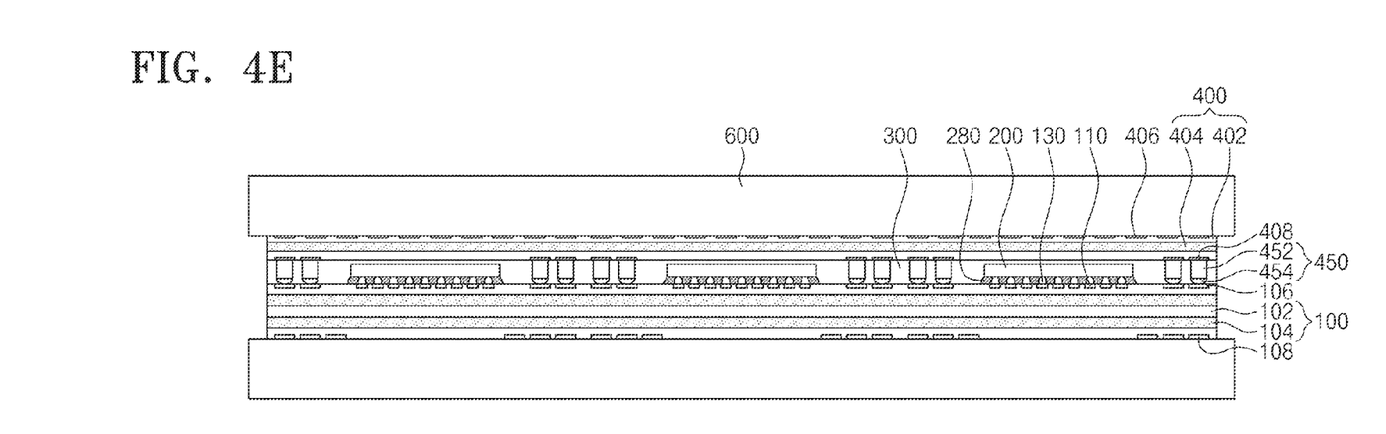

Referring to FIG. 4E, the interposer 400 and the substrate 100 may be thermally pressed together (e.g., using a bonding tool 600). The connecting member 450 may be in contact with the first circuit pattern 106 disposed on the top surface of the substrate 100. Heat applied during the thermal pressing may melt the solder 454 of the connecting member 450 to bond the connecting member 450 to the first circuit pattern 106. The melting temperature of the solder 454 may be similar to a hardening temperature of the non-conductive paste 310, and the pillar 452 may be melted at a temperature higher than a process temperature (e.g., in a range of 220 degrees Celsius to 300 degrees Celsius) during the thermal pressing process. The melting point of the pillar 452 may be higher than that of the solder 454. In addition, the non-conductive paste 310 may be hardened by the heat to form the non-conductive layer 300. The non-conductive layer 300 may physically contact the interposer 400.

In the manufacturing method according to the embodiments discussed herein, the processes may be relatively simplified as compared with processes in which an interposer is provided on a semiconductor chip after unit packages are separated from each other. Thus, embodiments of the inventive concepts make it possible to reduce the manufacturing time and the cost for manufacturing semiconductor packages.

Figure 4F:
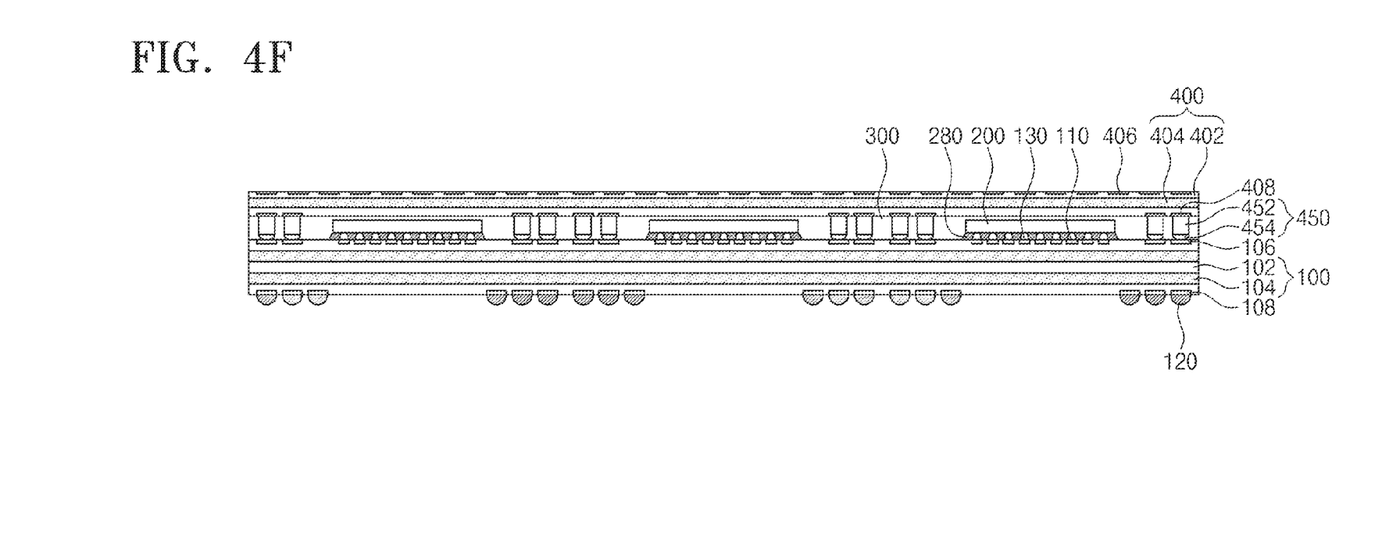

Referring to FIG. 4F, external terminals 120 may be bonded to the bottom surface of the substrate 100. The external terminals 120 may be provided on the external pads 108 of the substrate 100.

Figure 4G:
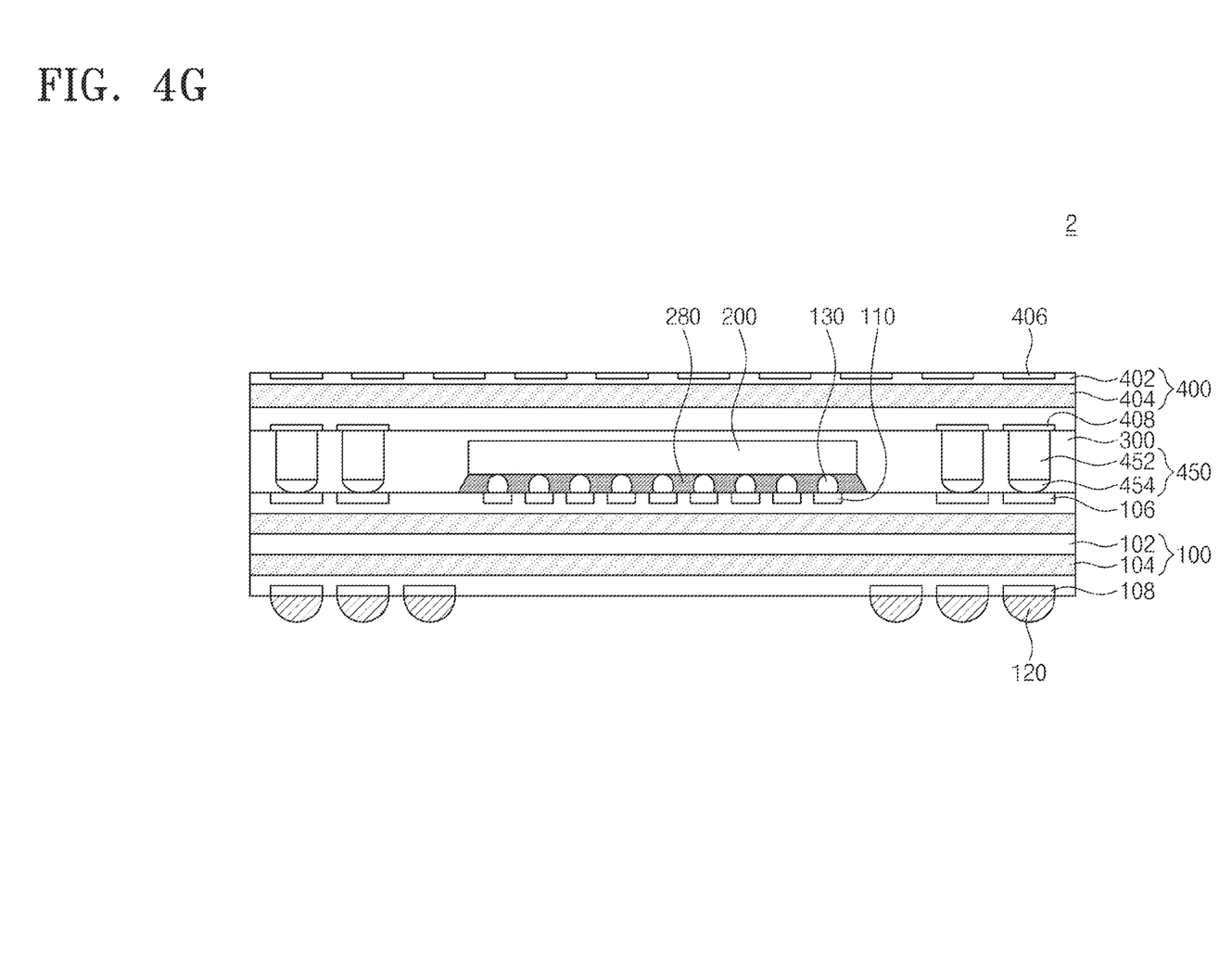

Referring to FIG. 4G, the substrate 100, the non-conductive layer 300, and the interposer 400 may be cut into separate unit packages, respectively including one or more semiconductor chips 200. Once separated from each other, the unit packages may correspond to semiconductor packages 2. A plurality of the semiconductor packages 2 may be formed by the cutting process, and each of the semiconductor packages 2 may include at least one semiconductor chip 200 and one interposer 400 sequentially stacked on one substrate 100.

Figure 5:
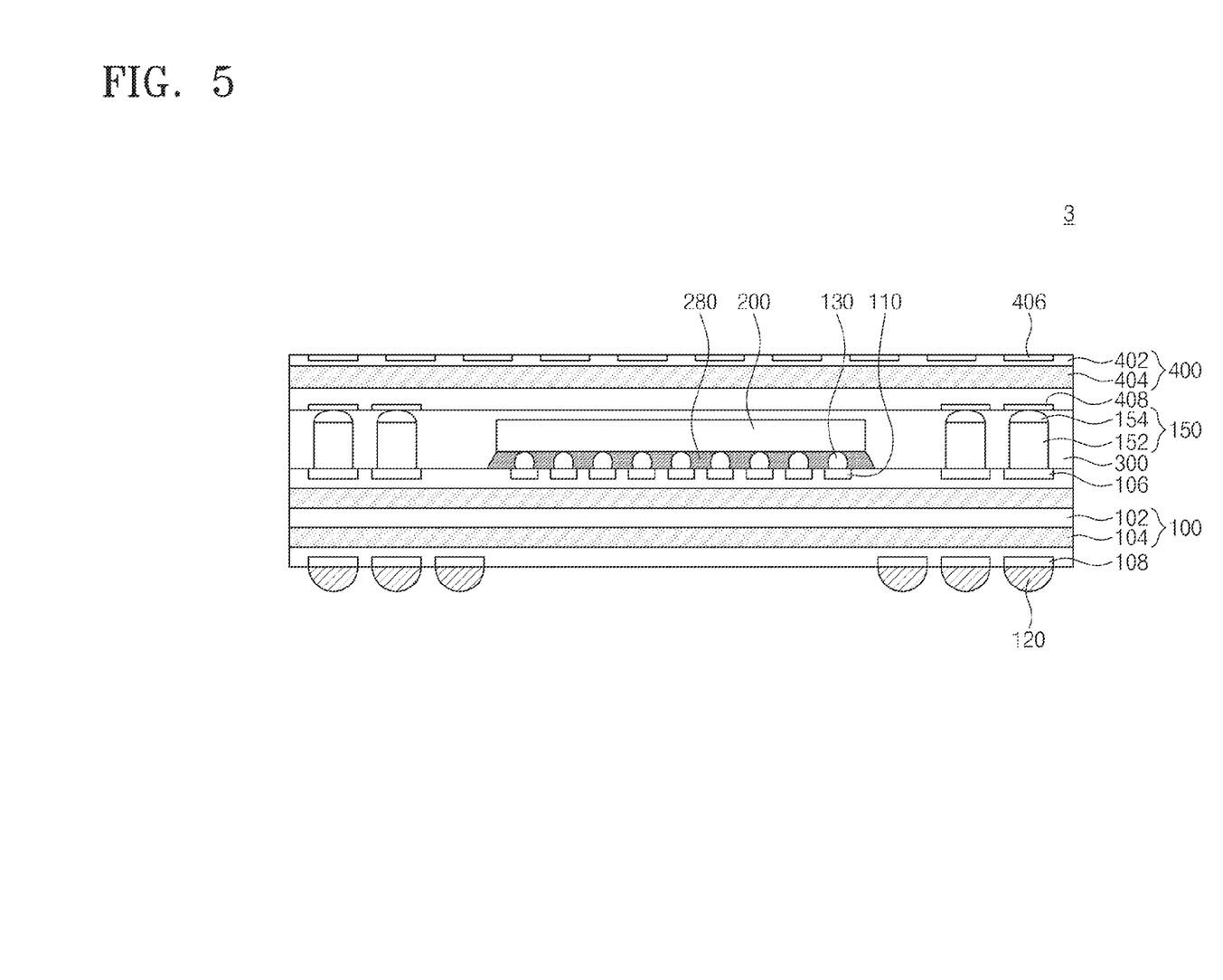
FIGS. 5 and 6 are cross-sectional views illustrating semiconductor packages, according to some embodiments of the inventive concepts.
Figure 6:
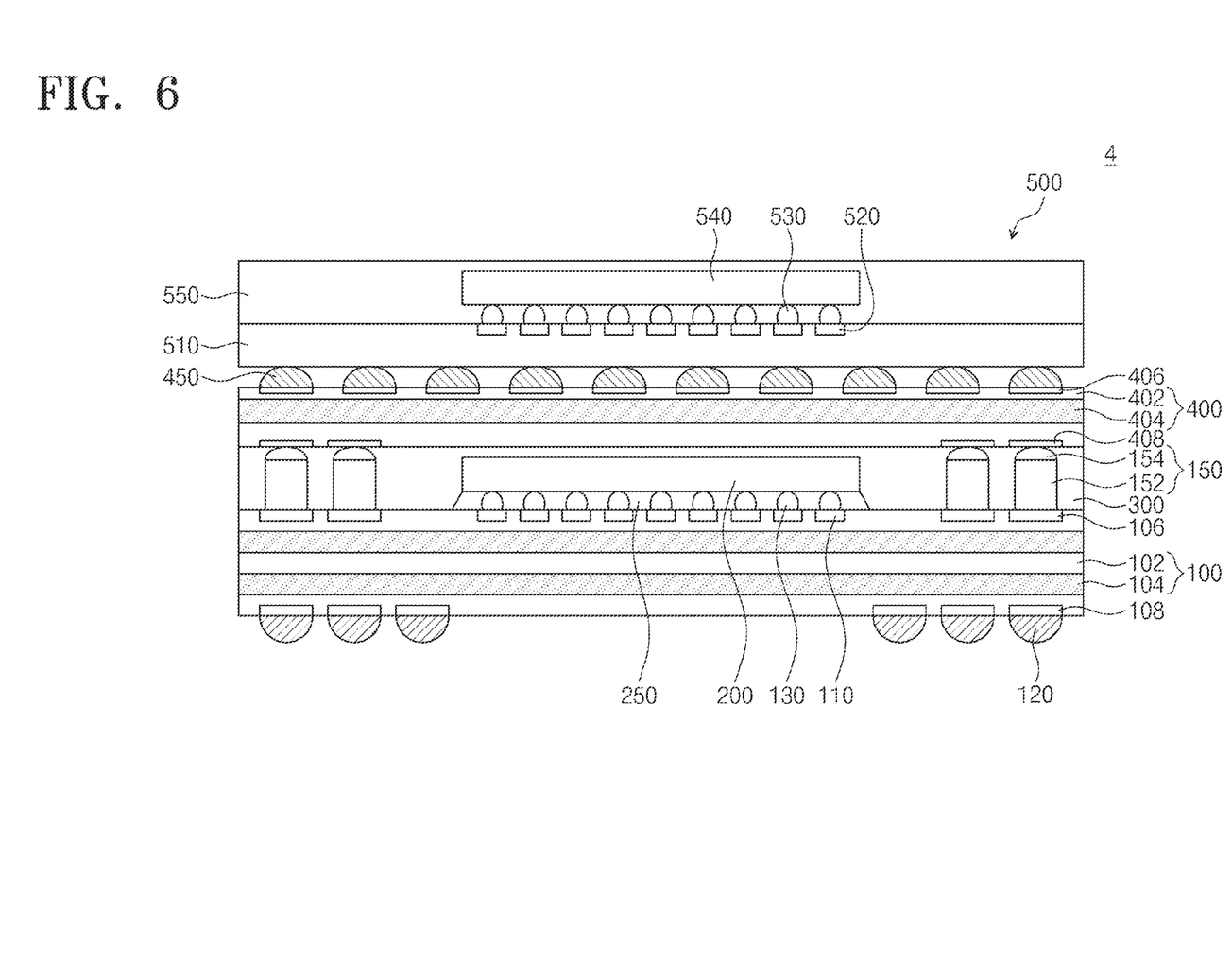

FIGS. 5 and 6 are cross-sectional views illustrating semiconductor packages according to some embodiments of the inventive concepts.

Referring to FIG. 5, a semiconductor package 3 may include a substrate 100 which, unlike the semiconductor package 2 described with respect to FIG. 4G, has connecting members 150. The underfill layer 280 may be provided between the substrate 100 and the semiconductor chip 200. The underfill layer 280 may be formed of a material having a hardening temperature that is lower than that of the non-conductive layer 300. When the non-conductive layer 300 is hardened, the pillar 152 of the connecting member 150 may not become melted so that the shape of the pillar 152 may be maintained. The solder 154 of the connecting member 150 may be bonded to the interposer pad 408 when the non-conductive layer 300 is hardened. The substrate 100 may be electrically connected to the interposer 400 through the connecting members 150.

Referring to FIG. 6, an upper package 500 may be disposed on the interposer 400 to form a package-on-package (PoP) device. The upper package 500 may include an upper substrate 510, an upper semiconductor chip 540, and a molding layer 550. The upper substrate 510 may be a multi-layered PCB. The upper semiconductor chip 540 may, for example, be a memory chip. The upper semiconductor chip 540 may be electrically connected to the upper substrate 510 through upper chip-connecting terminals 530. The upper chip-connecting terminals 530 may include at least one of tin (Sn), lead (Pb), nickel (Ni), gold (Au), silver (Ag), copper (Cu), or bismuth (Bi). The upper chip-connecting terminals 530 may be disposed on upper connecting pads 520 disposed on a top surface of the upper substrate 510. The molding layer 550 may be provided to cover the top surface of the upper substrate 510 and the upper semiconductor chip 540. The molding layer 550 may include an insulating polymer material such as an epoxy molding compound (EMC).

Upper solder balls 450 may be provided between the interposer 400 and the upper package 500. The upper solder balls 450 may be disposed on the second circuit patterns 406 of the top surface of the interposer 400. The upper solder balls 450 may include at least one of tin (Sn), lead (Pb), nickel (Ni), gold (Au), silver (Ag), copper (Cu), or bismuth (Bi). The upper solder balls 450 may electrically connect the interposer 400 to the upper substrate 510.

According to embodiments of the inventive concepts disclosed herein, warpage of the semiconductor package may be reduced or prevented due to the presence of the non-conductive layer provided between the substrate and the interposer, and the thickness of the semiconductor package may be reduced or minimized.

According to embodiments of the inventive concepts disclosed herein, the non-conductive layer instead of a molding layer may be provided between the substrate and the interposer, and thus the pitch of the connecting members may be reduced or minimized.

According to embodiments of the inventive concepts, the thermal pressing process may be performed in the state in which the interposer is provided on a plurality of the semiconductor chips, and thus the productivity of the semiconductor packages may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of manufacturing a semiconductor package, the method comprising:
   forming a connecting member on a top surface of a substrate, the connecting member protruding from the top surface;
   mounting a plurality of semiconductor chips on the substrate having the connecting member;
   applying a non-conductive paste on the substrate and the semiconductor chips;
   forming a supporting layer coupling each of the semiconductor chips to the substrate;
   aligning an interposer on the non-conductive paste;
   applying heat while pressing the interposer and the substrate against each other, thereby forming a non-conductive layer; and
   cutting the substrate, the non-conductive layer, and the interposer into unit packages separated from each other, wherein each unit package includes at least one of the semiconductor chips, and
   wherein the connecting member comprises:
      a pillar in contact with the substrate; and
      solder disposed on the pillar.

2. The method of claim 1, further comprising:
   melting the solder to bond the connecting member to the interposer,
   wherein a melting point of the pillar is higher than a melting point of the solder.

3. The method of claim 1,
   wherein forming the supporting layer comprises:
      coupling each of the semiconductor chips to the substrate by filling a space between the substrate and each of the semiconductor chips with the non-conductive paste.

4. The method of claim 3,
   wherein forming the supporting layer further comprises:
      applying heat of a temperature ranging from 50 degrees Celsius to 150 degrees Celsius to allow the non-conductive paste to flow.

5. The method of claim 3,
   wherein forming the supporting layer further comprises:
      providing an air pressure higher than a normal pressure to press the non-conductive paste into the space between the substrate and each of the semiconductor chips.

6. The method of claim 1,
   wherein forming of the supporting layer comprises:
      providing an epoxy-based underfill paste into a space between the substrate and each of the semiconductor chips; and
      hardening the epoxy-based underfill paste.

7. The method of claim 6,
   wherein a hardening temperature of the epoxy-based underfill paste is lower than a hardening temperature of the non-conductive paste.

8. The method of claim 1,
   wherein forming the non-conductive layer comprises:
      pressing a bottom surface of the substrate and a top surface of the interposer at the same time by a bonding tool;
      applying the heat to the connecting member to bond the connecting member to the interposer; and
      hardening the non-conductive paste.

9. The method of claim 1, further comprising:
   bonding an external terminal to a bottom surface of the substrate before the cutting of the substrate.

10. The method of claim 1, further comprising:
    stacking an upper package on one of the unit packages to form a package-on-package (PoP) device.

11. A method of manufacturing a semiconductor package, the method comprising:
    mounting a plurality of semiconductor chips on a top surface of a substrate;
    applying a non-conductive paste on the substrate and the semiconductor chips;
    forming a supporting layer between the substrate and each of the semiconductor chips;
    providing an interposer having a connecting member protruding toward the substrate onto the substrate;
    thermally pressing the interposer and the substrate to form a non-conductive layer between the substrate and the interposer,
    wherein forming the non-conductive layer comprises applying heat while pressing the interposer and the substrate against each other;
    bonding an external terminal to a bottom surface of the substrate; and
    cutting the substrate, the non-conductive layer, and the interposer between the semiconductor chips into unit packages separated from each other, wherein each unit package includes at least one of the semiconductor chips, and
    wherein the connecting member comprises:
       a pillar in contact with the interposer; and
       solder disposed on a bottom surface of the pillar.

12. The method of claim 11, further comprising:
    melting the solder to bond the connecting member to the substrate,
    wherein a melting point of the pillar is higher than a melting point of the solder.

13. The method of claim 11,
    wherein forming the supporting layer comprises:
       providing an epoxy-based underfill paste into a space between the substrate and each of the semiconductor chips; and
       hardening the epoxy-based underfill paste.

14. The method of claim 11,
    wherein forming the non-conductive layer comprises:
       pressing the substrate and the interposer using a bonding tool;
       applying heat to bond the connecting member to the substrate; and
       hardening the non-conductive paste.

15. The method of claim 11, further comprising:
    stacking an upper package on one of the unit packages separated from each other to form a package-on-package (PoP) device.

16. A method of manufacturing a semiconductor package, the method comprising:
    providing a substrate having a plurality of connecting pads;
    mounting a plurality of semiconductor chips onto a surface of the substrate having the plurality of connecting pads such that the semiconductor chips are spaced apart from the surface of the substrate and such that the semiconductor chips are electrically connected to the plurality of connecting pads;

providing a non-conductive material on the surface of the substrate wherein a portion of the non-conductive material partially fills a space between the semiconductor chips;

providing an interposer over the substrate having the non-conductive material provided thereon, wherein one of the interposer or the substrate includes a connecting member protruding from a surface thereof, wherein the connecting member includes a pillar and solder disposed on the pillar; and in a thermal pressing process, applying heat to form a non-conductive layer between the substrate and the interposer while pressing the interposer and the substrate against the connecting member, wherein the non-conductive material and the connecting member are arranged such that the connecting member is pressed into the non-conductive material during the thermal pressing process.

17. The method of claim 16, further comprising:
cutting the substrate, the non-conductive layer, and the interposer into separate unit packages, wherein each unit package includes at least one of the semiconductor chips.

18. The method of claim 16,
wherein providing the non-conductive material includes covering the semiconductor chips with non-conductive material.

19. The method of claim 16,
wherein the pillar is formed a material having a high melting point than the solder.

20. The method of claim 16, further comprising:
providing an epoxy-based underfill paste into a space between the substrate and the semiconductor chips before the providing the non-conductive material on the surface of the substrate; and
hardening the epoxy-based underfill paste.

* * * * *